United States Patent
Choi

(10) Patent No.: US 7,801,630 B2
(45) Date of Patent: Sep. 21, 2010

(54) METHOD AND APPARATUS FOR CONTROLLING RECORDING LEVELS

(75) Inventor: Jong Cheol Choi, Incheon-si (KR)

(73) Assignee: LG Electronics Inc., Seoul (KR)

( * ) Notice: Subject to any disclaimer, the term of this patent is extended or adjusted under 35 U.S.C. 154(b) by 1679 days.

(21) Appl. No.: 10/758,073

(22) Filed: Jan. 16, 2004

(65) Prior Publication Data

US 2004/0148043 A1 Jul. 29, 2004

(30) Foreign Application Priority Data

Jan. 20, 2003 (KR) .................... 10-2003-0003779

(51) Int. Cl.
*G06F 17/00* (2006.01)
*H03G 3/00* (2006.01)
*G11B 20/10* (2006.01)

(52) U.S. Cl. ................ 700/94; 381/107; 369/47.25

(58) Field of Classification Search ............. 700/94; 381/104, 105, 106, 107, 108, 109, 119; 369/47.25, 369/124.1

See application file for complete search history.

(56) References Cited

U.S. PATENT DOCUMENTS

| | | | | | |
|---|---|---|---|---|---|
| 5,404,315 | A | * | 4/1995 | Nakano et al. | 381/102 |
| 5,666,430 | A | * | 9/1997 | Rzeszewski | 381/107 |
| 5,872,852 | A | * | 2/1999 | Dougherty | 381/57 |
| 6,621,768 | B1 | * | 9/2003 | Keller et al. | 369/30.05 |
| 7,072,477 | B1 | * | 7/2006 | Kincaid | 381/107 |
| 2004/0042103 | A1 | * | 3/2004 | Mayer | 360/7 |

FOREIGN PATENT DOCUMENTS

JP 02-089252 * 3/1990

OTHER PUBLICATIONS

"Replay Gain—A Proposed Standard, Replay Gain File Format", Aug. 27, 2001, retrieved by www.archive.org, http://web.archive.org/web/20010827020146/privatewww.essex.ac.uk/~djmrob/replaygain/file_format.html, p. 1.*

"Replay Gain—A Proposed Standard, Calibration", Jan. 6, 2002, retrieved by www.archive.org, http://web.archive.org/web/20020106152700/http://privatewww.essex.ac.uk/~djmrob/replaygain/calibration.html, pp. 1-2.*

(Continued)

*Primary Examiner*—Vivian Chin
*Assistant Examiner*—Daniel R Sellers
(74) *Attorney, Agent, or Firm*—Birch, Stewart, Kolasch & Birch, LLP

(57) ABSTRACT

A method and apparatus for controlling an audio recording level. The apparatus variably controls a recording level of audio data recorded on a rewritable recording medium such as a DVD-RW disk on the basis of either a firstly-recorded audio level average value in song units or a previously-recorded audio level average value in song units, and then records the resultant data on the recording medium. In this way, the apparatus records the audio data to be recorded on a single recording medium at a prescribed audio recoding level within the appropriate range, resulting in even playback audio levels regardless of the type and/or format of audio data.

14 Claims, 7 Drawing Sheets

OTHER PUBLICATIONS

"Replay Gain—A Proposed Standard, Calculation", Aug. 27, 2001, retrieved by www.archive.org, http://web.archive.org/web/20010827010748/privatewww.essex.ac.uk/~djmrob/replaygain/calculating_rg.html, pp. 1-2.*

"Replay Gain—A Proposed Standard, Outline", Aug. 27, 2001, retrieved by www.archive.org, http://web.archive.org/web/20010827022814/privatewww.essex.ac.uk/~djmrob/replaygain/outline.html, p. 1.*

"Replay Gain—A Proposed Standard, Introduction", Oct. 5, 2001, retrieved by www.archive.org, http://web.archive.org/web/20011005165428/privatewww.essex.ac.uk/~djmrob/replaygain/index.html, p. 1.*

"Replay Gain—A Proposed Standard, Contents", Oct. 31, 2001, retrieved by www.archive.org, http://web.archive.org/web/20011031173847/privatewww.essex.ac.uk/~djmrob/replaygain/contents.html, p. 1.*

"MP3 CD Maker Frequently Asked Questions", Nov. 2, 2001, retrieved by www.archive.org, http://web.archive.org/web/20011102102749/www.share2.com/mp3cdmaker/faqs.htm, pp. 1-4.*

"Replay Gain—A Proposed Standard, Outline of Player Requirements", Aug. 27, 2001, retrieved by www.archive.org, http://web.archive.org/web/20010827024445/privatewww.essex.ac.uk/~djmrob/replaygain/player.html, pp. 1-2.*

* cited by examiner

METHOD AND APPARATUS FOR CONTROLLING RECORDING LEVELS

The present application claims, under 35 U.S.C. §119, the priority benefit of Korean Patent Application No. 10-2003-0003779 filed Jan. 20, 2003, the entire contents of which are herein fully incorporated by reference.

BACKGROUND OF THE INVENTION

1. Field of the Invention

The present invention relates to a method and apparatus for controlling an audio recording level, and more particularly to a method and apparatus for variably controlling a recording level of audio data recorded on a rewritable recording medium such as a DVD-RW disk.

2. Description of the Background Art

In recent times, there has been newly developed an optical disk capable of storing video data and/or audio data of high quality and long playtime. This optical disk, for example, a DVD-RW disk, has become increasingly popular as a recording medium. Therefore, there has been proposed an optical disk apparatus, for example, a DVD-Recorder, for writing or reading video/audio data on the optical disk and it is expected that such optical disk apparatus will be further developed.

Audio data having a variety of audio formats may be written or recorded on the optical disk. For example, audio data in song units may be recorded on one optical disk in either the DVD-Audio format or the MP3-Audio format. The optical disk apparatus reads out DVD-Audio formatted audio data or MP3-Audio formatted audio data from the optical disk, and decodes them with original audio data to reproduce them.

In this regard, a user records many songs of various audio formats on a single optical disk using an optical disk apparatus, and selects one song data from all the song data recorded on the optical disk to instruct the optical disk apparatus to reproduce the selected song data. However, since the optical disk apparatus directly records a variety of different types/formats of external audio data on an optical disk such as a DVD-RW disk, the audio recording levels of the recorded songs are different from each other, e.g., in the case where audio data input levels are different for every song. Therefore, irregular playback audio levels for every song occur in an audio data playback operation. This is a problem because the user must manually control the audio volume level to play different songs at the desired audio volume level.

SUMMARY OF THE INVENTION

Therefore, the present invention has been made in view of the above problems, and it is an object of the present invention to provide a method and apparatus for controlling an audio recording level, which variably controls a recording level of audio data to be recorded on a rewritable recording medium such as a DVD-RW disk on the basis of either a firstly-recorded audio level average value in song units or a previously-recorded audio level average value in song units, and then records the resultant data on the recording medium, in such a way that it records the audio data to be recorded on a single recording medium at a prescribed audio recoding level within the appropriate range.

In accordance with one aspect of the present invention, the above and other objects can be accomplished by the provision of a method for controlling an audio recording level, including the steps of: a) recording entry audio data in song units and simultaneously decoding the audio data, and detecting an audio level average of the decoded data; and b) variably controlling an audio level of a song to be recorded later on the basis of the detected audio level average.

In accordance with another aspect of the present invention, there is provided a method for controlling an audio recording level, including the steps of: a) decoding entry audio data to be recorded in song units, and detecting an audio level average of the decoded entry audio data; and b) variably controlling a level of subsequent decoded audio data on the basis of the detected audio level average, encoding the variably controlled audio data level, and recording the encoded audio data to a recording medium.

In accordance with yet another aspect of the present invention, there is provided an apparatus for controlling an audio recording level, including means for recording entry audio data in song units and simultaneously decoding the audio data, and detecting an audio level average of the decoded data; and means for variably controlling an audio level of a song to be recorded later on the basis of the detected audio level average.

In accordance with yet another aspect of the present invention, there is provided an apparatus for controlling an audio recording level, including: first means for decoding entry audio data to be recorded in song units, and detecting an audio level average of the decoded entry audio data; and second means for variably controlling a level of subsequent decoded audio data on the basis of the detected audio level average, encoding the variably controlled audio data level, and recording the encoded audio data to a recording medium These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings.

Figure 1:
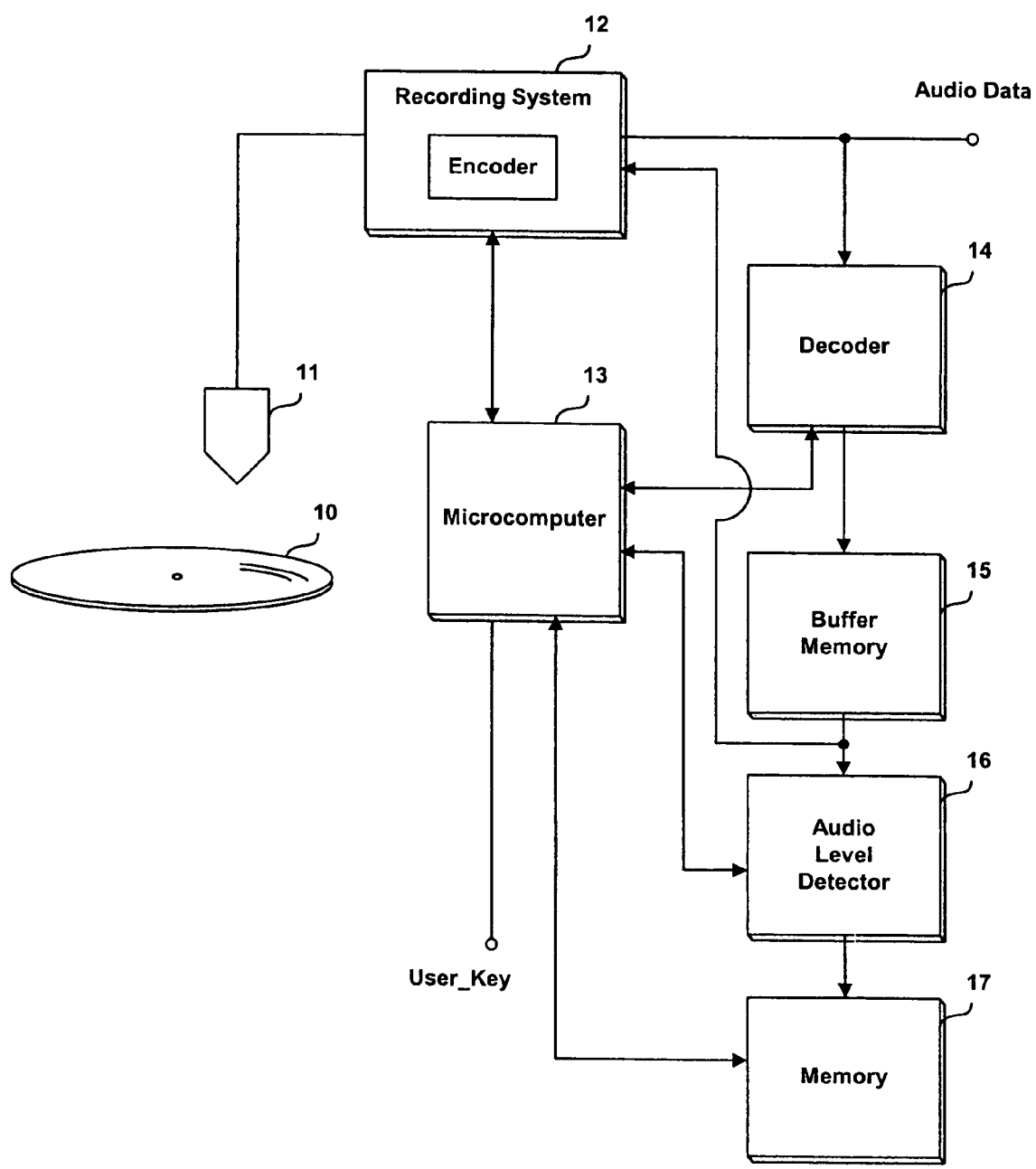
FIG. 1 is a block diagram of an optical disk apparatus with an audio recording level controller in accordance with a first embodiment of the present invention.

FIG. 1 is a block diagram of an optical disk apparatus with an audio recording level controller in accordance with a first embodiment of the present invention. The optical disk apparatus such as a DVD-Recorder may include an optical pick-up unit 11, a recording system 12, a microcomputer 13, a decoder 14, a buffer memory 15, an audio level detector 16, and a memory 17, all operatively coupled.

The recording system 12 converts a variety of different types (e.g., digital, compressed, analog, etc.) and/or formats (e.g., DVD-Audio formatted, MP3-Audio formatted, etc.) of external audio data into signals appropriate for a recording operation, processes the converted signals, and records the processed signals on an optical disk such as a DVD-RW disk 10. The recording system 12 may further include an encoder for encoding audio data.

The decoder 14 receives and decodes external audio data which is encoded for example with the DVD-Audio format or the MP3-Audio format with original audio data upon receiving an operation control signal from the microcomputer 13, in such a way that it restores the above audio data to original audio data. The buffer memory 15 temporarily stores the decoded audio data in song units.

The audio level detector 16 detects a level of the temporarily stored audio data from the buffer memory 15 and thereby determines an audio level average Audio_Level_Average and maximum/minimum audio levels Audio_level_Max/Min in song units, e.g., for each song unit.

Figure 2:
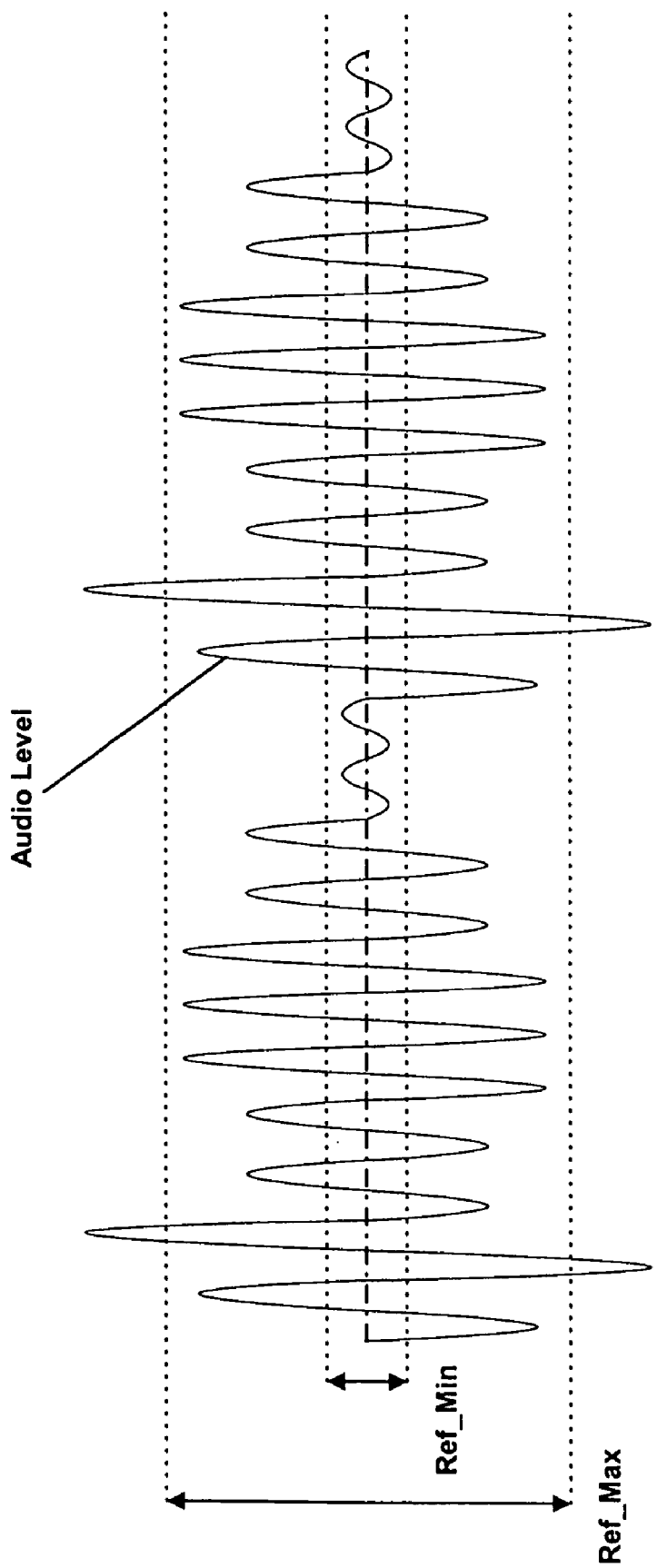
FIG. 2 is an example of a waveform diagram illustrating an audio level range from a minimum reference level to a maximum reference level according to the inventive audio recording level control method.

As shown in FIG. 2, the audio level detector 16 excludes an audio data level, outside of a prescribed range extending from a maximum audio reference level (Ref_Max) to a minimum audio reference level (Ref_Min), from the process of determining the audio level average, such that it prevents the maximum/minimum audio levels Audio_Level_Max/Min (depending on the unique characteristics for each song) from affecting the overall audio level average of every song. Using the audio data within the prescribed range, the audio level detector 16 determines or calculates the audio level average for that song or the designated song unit. Then, the microcomputer 13 receives and stores the determined audio level average and maximum/minimum audio levels in song units in the memory 17.

In all the embodiments of the present invention, a song unit can be one song, a part of a song, multiple songs, or any unit defined by a user, host system, etc.

When the next song or song unit is received by the recording system 12, the microcomputer 13 variably controls the audio data level of the currently received song or song unit restored and decoded by the decoder 14 on the basis of an audio level average of a previous song or song unit stored in the memory 17, such that the audio data level of the current song/song unit is shifted to an appropriate audio data level at the recording system 12. The microcomputer 13 can receive user commands/instructions (User-Key) to control an operation of the optical disk apparatus (e.g., an instruction to begin recording).

Then successive audio recording level control operations, including re-encoding the audio data having the variably controlled audio level in the encoder of the recording system 12 and recording the re-encoded data in the optical disk 10, are executed, which will hereinafter be described in detail.

Figure 3:
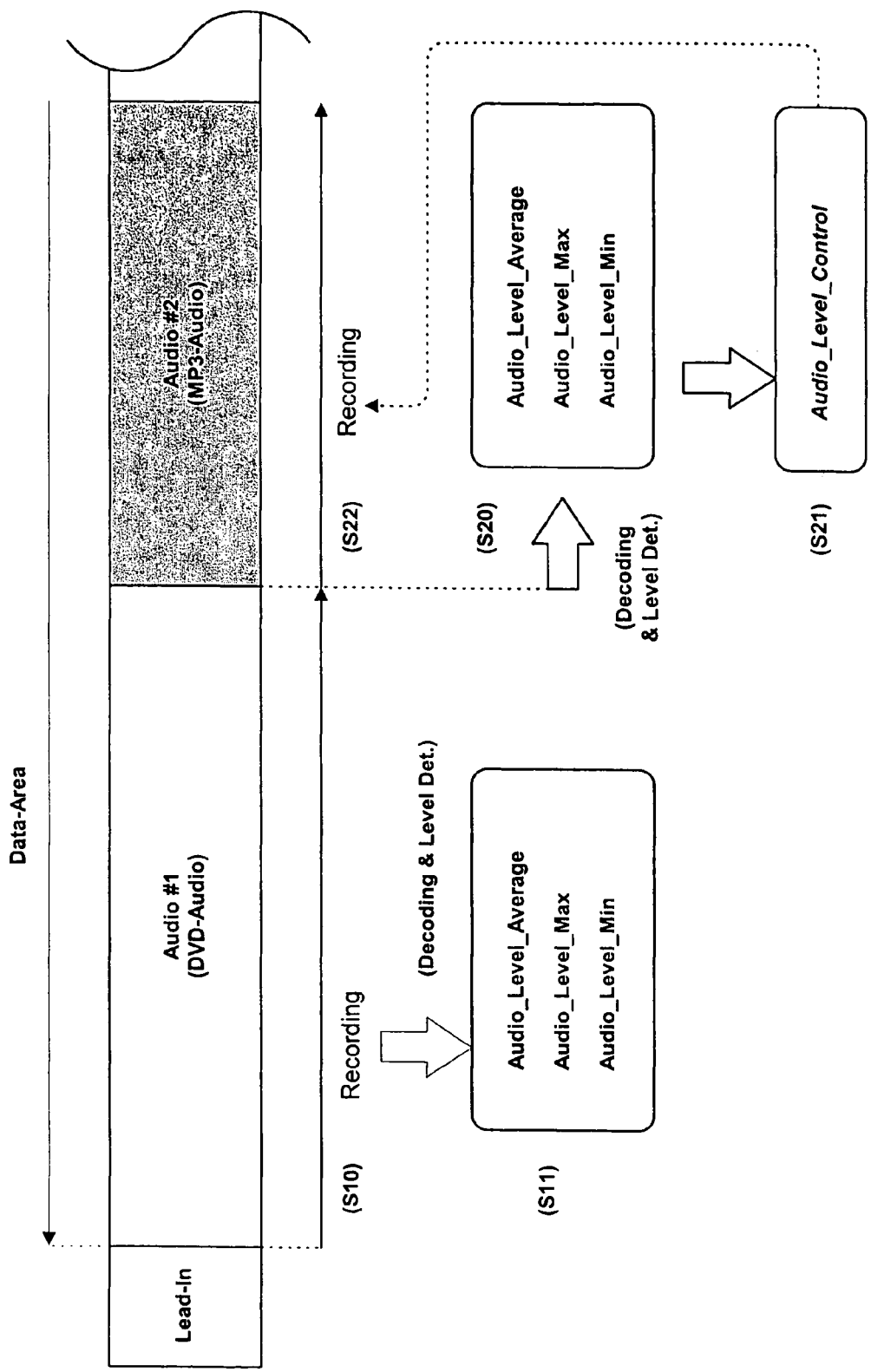
FIG. 3 is a flow chart illustrating an audio recording level control method in accordance with an embodiment of the present invention.

FIG. 3 is a flow chart illustrating an audio recording level control method in accordance with an embodiment of the present invention. Referring to FIG. 3, in the case where a first audio song is to be recorded on a data area of an optical disk inserted into the apparatus of FIG. 1 or in other type of recording medium such as a flash memory, and more specifically, in the case where a first audio song Audio#1 of the DVD-Audio format is to be recorded on the data area of the optical disk (or some designated area in the recording medium), the microcomputer 13 controls the recording system 12 to process and convert entry audio data of the first audio song Audio#1 into signals appropriate for a recording operation, and then processes the converted signals in such a way that it executes successive recording operations for recording data on the optical disk 10 (S10).

The microcomputer 13 controls the decoder 14 simultaneously with executing the above recording operation, such that the decoder 14 decodes/restores audio data of the first audio song Audio#1 with/to original audio data, and the buffer memory 15 temporarily stores the restored audio data. In this case, the audio level detector 16 detects a level of the temporarily stored audio data, and thereby detects an audio level average Audio_Level_Average of the first audio song Audio#1 and the maximum/minimum audio levels Audio_level_Max/Min of the first audio song Audio#1. At this time, the audio level detector 16 excludes an audio data level, outside of a prescribed range extending from a maximum audio reference level Ref_Max to a minimum audio reference level Ref_Min, from the process of detecting the audio level average Audio_Level_Average. Thereafter, the determined audio level average Audio_Level_Average and the determined maximum/minimum audio levels Audio_Level_Max/Min of the first audio song Audio#1 are stored in the memory 17 under control of the microcomputer 13 (S11).

In the meantime, in the case where a second audio song is to be recorded on the optical disk, for example, where a second audio song Audio#2 of the MP3-Audio format is to be recorded on the optical disk, the microcomputer 13 controls the recording system 12 to pause such a recording operation, and at the same time controls the decoder 14 to decode/restore audio data of the second audio song Audio#2 with/to original audio data. Then the buffer memory 15 temporarily stores therein the resultant audio data.

The audio level detector 16 detects a level of the temporarily stored audio data of the second audio song Audio#2, and thereby detects an audio level average Audio_Level_Average and maximum/minimum audio levels Audio_level_Max/Min of the second audio song Audio#2 (S20).

The microcomputer 13 then compares the detected audio level average of the second audio song Audio#2 with the stored audio level average of the first audio song Audio #1 to find out a difference value between the two audio level averages, i.e., an offset value, adjusts the currently decoded audio data level of the second audio song by the offset value and then variably control the audio level of the second audio song Audio#2, e.g., by generating and outputting an Audio_Level_Control signal to the recording system 12 (S21).

The audio data having the variably controlled audio data of the second audio song Audio#2 is then encoded by the encoder of the recording system 12 and is converted/processed into a prescribed signal appropriate for the recording operation onto the disk 10, in such a way that successive audio recording level control/recording operations for recording the resultant audio data on a data area of the optical disk 10 as the second audio song are performed (S22).

The microcomputer 13 may store the audio level average Audio_Level Average and the maximum/minimum audio levels Audio_level_Max/Min of the second audio song Audio#2 in the memory 17.

The above data of Audio_Level_Average and Audio_level_Max/Min of the second audio song Audio#2 may be used as an audio level control reference value for the next audio song (e.g., a third audio song), or any previously stored audio level average Audio_Level_Average can be used as an audio level control reference value for the next or subsequent audio song or song unit. For instance, the microcomputer 13 may variably control audio recording levels of all the audio songs to be recorded later using the audio level average of the first audio song or any previous audio song.

Although FIG. 3 depicts the first and second audio songs to be in the DVD-Audio format and the MP3-Audio format, respectively, the present methods are applicable to controlling the recording levels of multiple audio songs/song units in any different type and/or format. Further, the methods of the present invention (including FIG. 3 method) are applicable to any of the devices depicted in subsequent FIGS. 4-7 to be discussed below.

Figure 4:
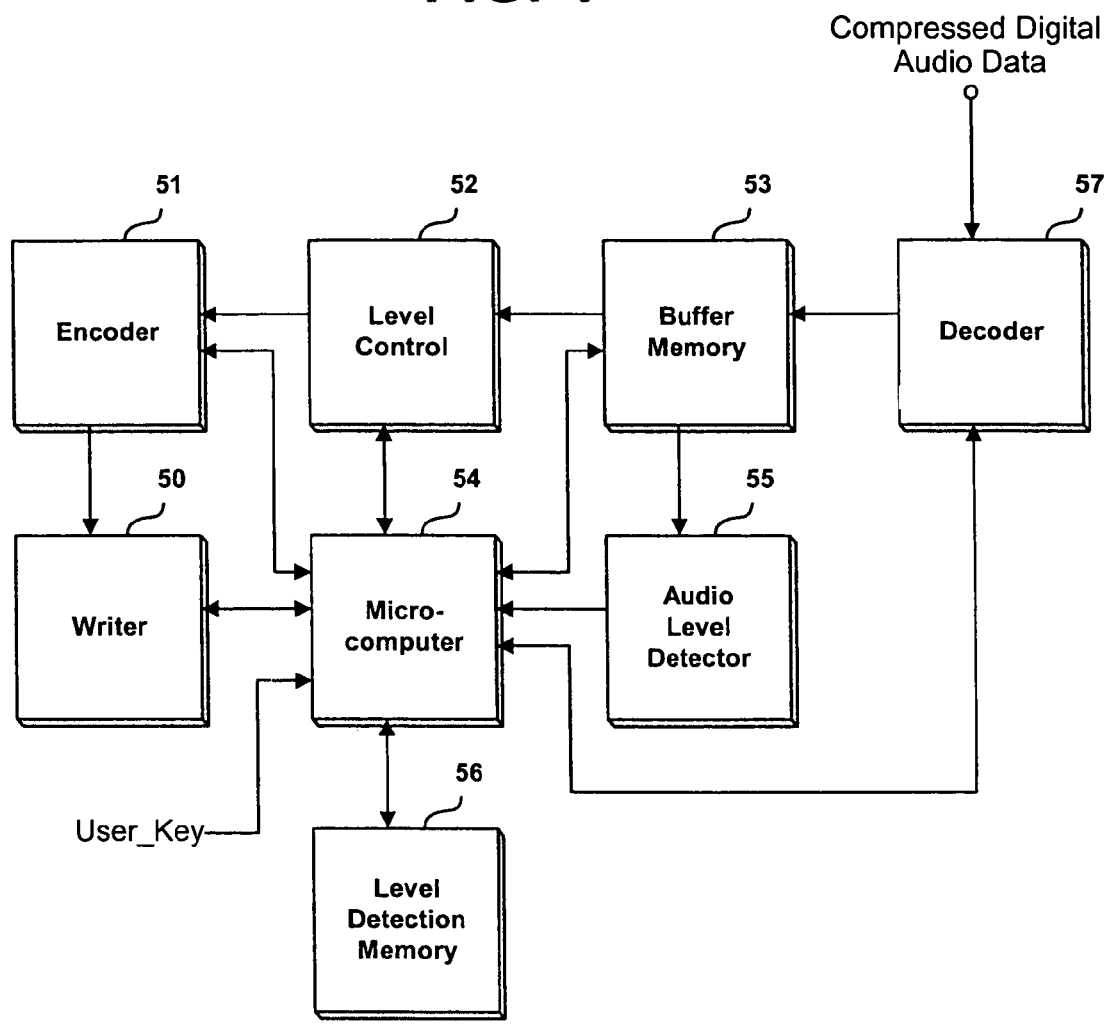
FIG. 4 is a block diagram of an audio recording level controller in accordance with a second embodiment of the present invention.

FIG. 4 is a block diagram of an audio recording level controller in accordance with a second embodiment of the present invention. In this embodiment, compressed digital audio data are received and processed by the recording level controller. As shown in FIG. 4, the audio recording level controller for recording external compressed digital audio data includes a writer 50, an encoder 51, a level controller 52, a buffer memory 53, a microcomputer 54, an audio level detector 55, a level detection memory 56, and a decoder 57, all operatively coupled.

The decoder 57 decodes the external compressed digital audio data, and thereby restores it to original audio data. The buffer memory 53 temporarily stores the audio data restored by the decoder 57, for example, audio data in song units. The audio level detector 55 reads the temporarily stored audio data, and thereby detects an audio level average Audio_Level_Average and maximum/minimum audio levels Audio_Level_Max/Min in song units, e.g., for each song unit, as discussed in the first embodiment.

The microcomputer 54 receives and stores the detected audio level average and maximum/minimum audio levels in song units in the level detection memory 56, and at the same time controls the level controller 52.

The level controller 52 variably controls an audio data level of a current song or song unit being read out from the buffer memory 53 on the basis of the audio level average of a previous or first song/song unit pre-stored in the level detection memory 56, such that the audio data level of the current song/song unit is shifted to an appropriate audio data level at the level controller 52.

In this regard, audio CD audio data are sampled with 44.1 kHZ and quantized by 16 bits, which means that the interval of each sampled audio data is 1/44100 seconds and the signal level of the sampled audio data is expressed by the value between the −32768 step and 32767 step. In this case, the higher absolute value of the sampled audio data means the bigger volume in sound and the lower absolute value the smaller volume in sound. Therefore the absolute value of the signal level should be raised up within the range between the −32768 and 32767 steps to increase the volume of a desired digital signal.

The encoder 51 then encodes the audio data having the variably controlled audio level with data appropriate for a recording operation. The writer 50 then records the encoded audio data in a recording medium. Here the recording medium may be an optical disk such as a CD-R/RW disk or a DVD-R/RW disk, a HDD (Hard Disk Driver), a DRAM (Dynamic Random Access Memory), or a flash memory.

Figure 5:
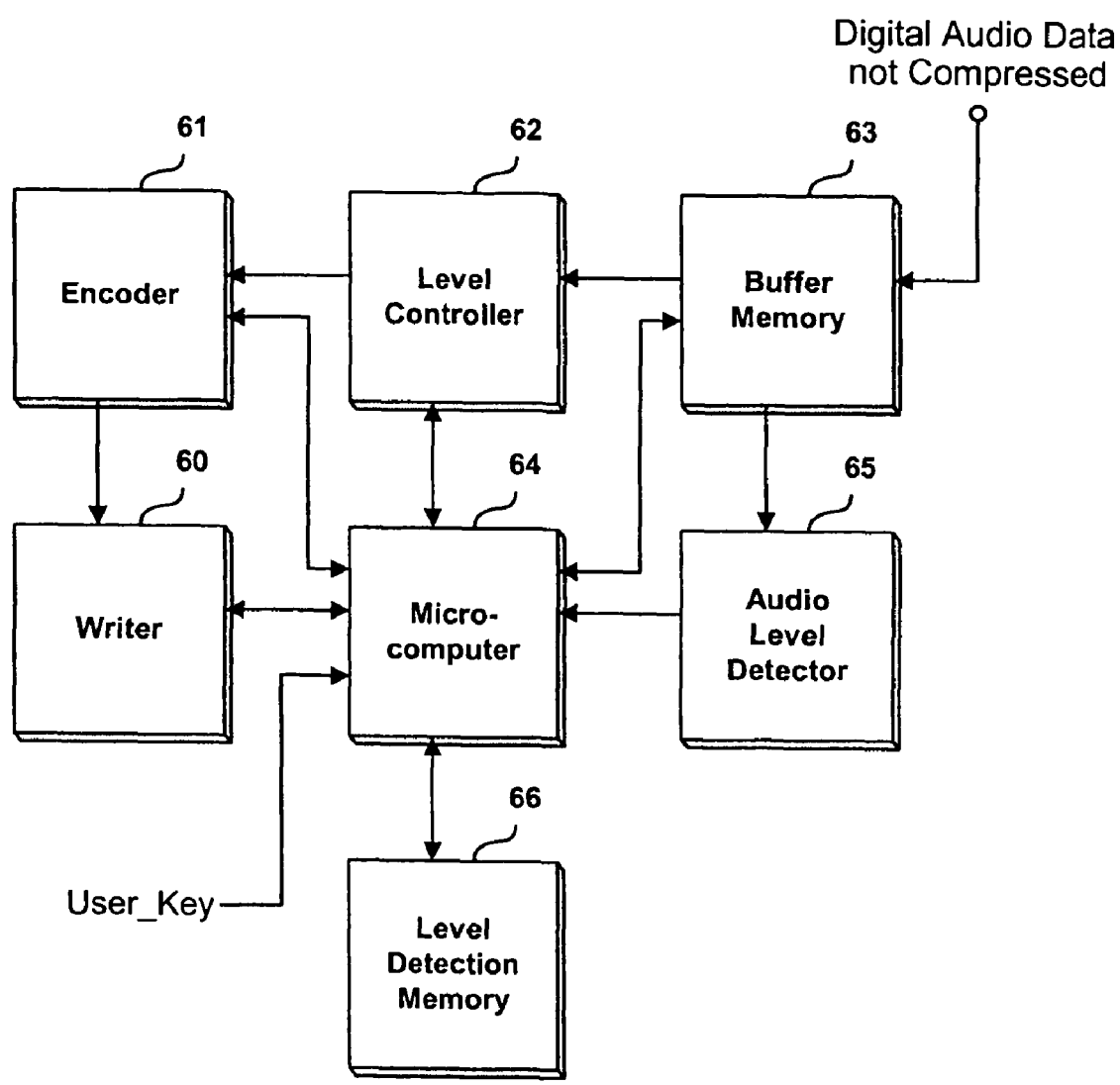
FIG. 5 is a block diagram of an audio recording level controller in accordance with a third embodiment of the present invention.

FIG. 5 is a block diagram of an audio recording level controller in accordance with a third embodiment of the present invention. In this embodiment, digital audio data that are not compressed are received and processed by the recording level controller. As shown in FIG. 5, the audio recording level controller for recording external uncompressed audio data includes a writer 60, an encoder 61, a level controller 62, a buffer memory 63, a microcomputer 64, an audio level detector 65, and a level detection memory 66, all operatively coupled.

The buffer memory 63 receives and temporarily stores therein external uncompressed digital audio data, for example, decompressed digital audio data in song units. The audio level detector 65 reads the temporarily stored audio data, and thereby detects an audio level average and maximum/minimum audio levels in song units as discussed in the previous embodiments. The microcomputer 64 stores the audio level average and maximum/minimum audio levels in song units in the level detection memory 66, and at the same time controls the level controller 62.

The level controller 62 variably controls the audio data level of a current song/song unit being read out from the buffer memory 63 on the basis of the audio level average of a previous or first song/song unit pre-stored in the level detection memory 66, such that the audio data level of the current song/song unit is shifted to an appropriate audio data level at the level controller 62. The encoder 61 then encodes the audio data having the variably controlled audio level with data appropriate for a recording operation. The writer 60 then records the encoded audio data in a recording medium. Here the recording medium may be an optical disk such as a CD-R/RW disk or a DVD-R/RW disk, a HDD (Hard Disk Driver), a DRAM (Dynamic Random Access Memory), or a flash memory.

Figure 6:
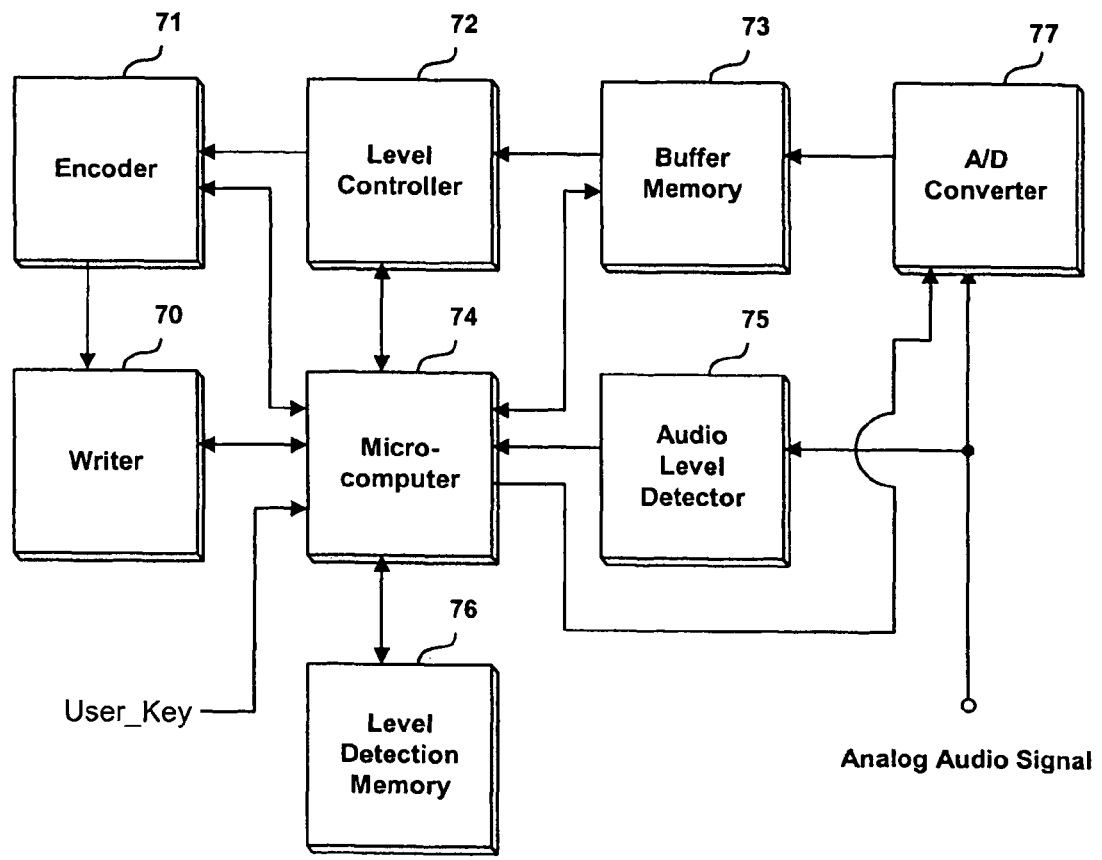
FIG. 6 is a block diagram of an audio recording level controller in accordance with a fourth embodiment of the present invention.

FIG. 6 is a block diagram of an audio recording level controller in accordance with a fourth embodiment of the present invention. In this embodiment, analog audio data are received and processed by the recording level controller. As shown in FIG. 6, the audio recording level controller for recording external analog audio data includes a writer 70, an encoder 71, a level controller 72, a buffer memory 73, a microcomputer 74, an audio level detector 75, a level detection memory 76, and an A/D converter 77, all operatively coupled.

The A/D converter 77 converts the external analog audio data into digital audio data. The buffer memory 73 temporarily stores therein the output digital audio data of the A/D converter 76, for example, digital audio data in song units. The audio level detector 75 detects the waveform shape of the analog audio signal, and thereby detects an audio level average and maximum/minimum audio levels in song units as discussed above in the previous embodiments.

The microcomputer 74 receives and stores the audio level average and maximum/minimum audio levels of song units in the level detection memory 76, and at the same time controls the level controller 72.

The level controller 72 variably controls the audio data level of a current song/song unit being read out from the buffer memory 73 on the basis of the audio level average of a previous or first song/song unit pre-stored in the level detection memory 76, such that the audio data level of the current song/song unit is shifted to an appropriate audio data level at the level controller 72.

The encoder 71 then encodes the audio data having the variably controlled audio level with data appropriate for a recording operation. The writer 70 then records the encoded audio data in a recording medium. Here, the recording medium may be an optical disk such as a CD-R/RW disk or a DVD-R/RW disk, a HDD (Hard Disk Driver), a DRAM (Dynamic Random Access Memory), or a flash memory.

Figure 7:
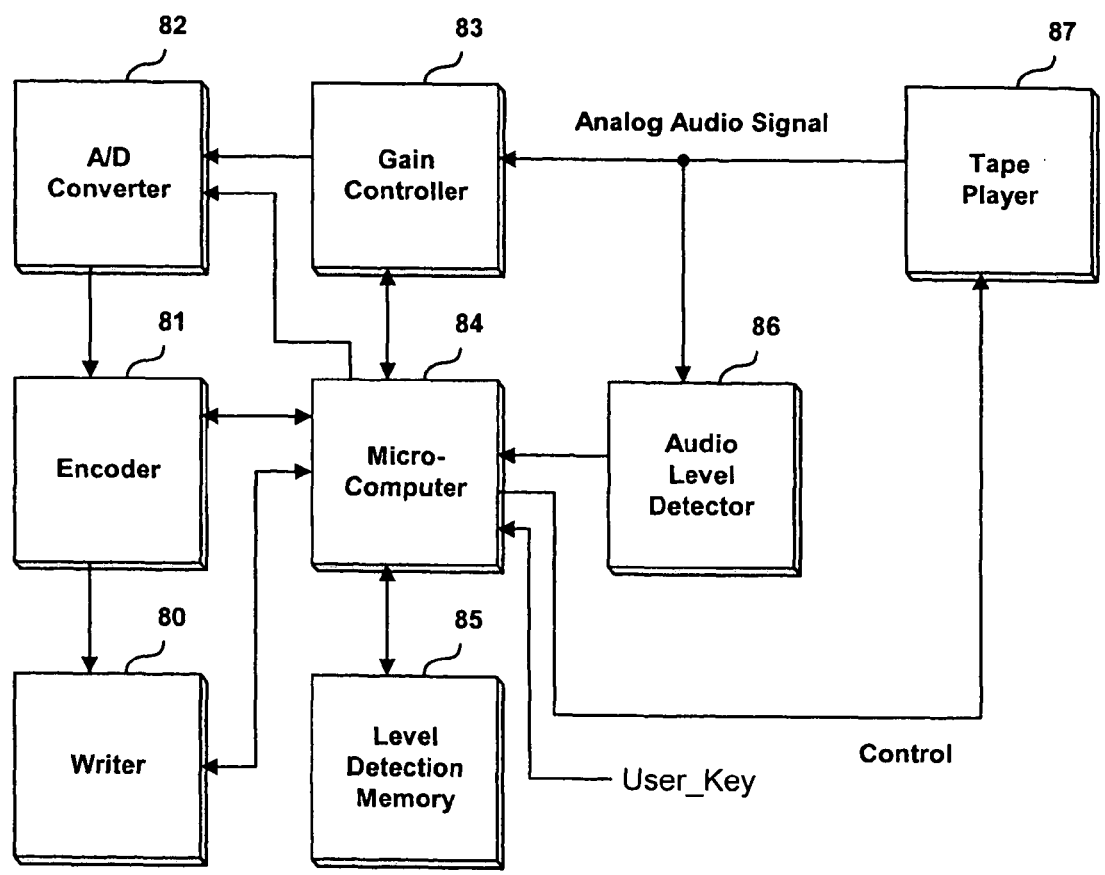
FIG. 7 is a block diagram of an audio recording level controller in accordance with a fifth embodiment of the present invention.

FIG. 7 is a block diagram of an audio recording level controller in accordance with a fifth embodiment of the present invention. In this embodiment, the audio recording level controller receives analog audio data from a tape player and processes them. As shown in FIG. 7, the audio recording level controller for recording external analog audio data includes a writer 80, an encoder 81, an A/D converter 82, a gain controller 83, a microcomputer 84, a level detection memory 85, and an audio level detector 86, all operatively coupled. The audio recording level controller may further include a tape player 87 therein, or may be connected to the tape player 87.

The microcomputer 84 controls the tape player 87 to transmit an analog audio signal to the gain controller 84. In this case, the audio level detector 86 detects the waveform shape of the analog audio signal, and thereby detects an audio level average and maximum/minimum audio levels in song units as discussed above in the previous embodiments.

The microcomputer 84 receives and stored the audio level average and maximum/minimum audio levels in song units in the level detection memory 85 as discussed above in the previous embodiments, and at the same time controls the gain controller 83.

The gain controller 83 variably controls the gain value of the current song/song unit on the basis of the audio level average of a previous or first song/song unit pre-stored in the level detection memory 85, such that the audio signal level of the current song/song unit is shifted to an appropriate audio signal level at the gain controller 83.

This analog audio signal having the variably controlled audio level is then converted into digital audio data by the A/D converter 82 and then transmitted to the encoder 81. The encoder 81 then encodes the received digital audio data with data appropriate for a recording operation. The writer 80 records the encoded audio data in a recording medium. Here, the recording medium may be an optical disk such as a CD-R/RW disk or a DVD-R/RW disk, a HDD (Hard Disk Driver), a DRAM (Dynamic Random Access Memory), or a flash memory.

In the meantime, in the same manner as the first embodiment of the present invention, the aforementioned second to fifth embodiments may variably control audio recording levels of all the audio songs to be recorded later using the audio level average of the first audio song/song unit or any previous audio song/song unit.

The present invention is also equally applicable to an optical disk apparatus, a PC equipped with a recording medium such as a HDD, and a variety of other appliances.

As apparent from the above description, the present invention provides a method and apparatus for controlling an audio recording level, which records the audio data to be recorded on a single recording medium at a prescribed audio recoding level within the appropriate range, resulting in even playback audio levels regardless of the format and/or type of audio data.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling an audio recording level, comprising the steps of:

a) recording entry audio data in song units and simultaneously decoding the audio data, and detecting an audio level average of the decoded data in song units; and b) variably controlling an audio level of a song to be recorded later on the basis of the detected audio level average, wherein the step b) comprises:

calculating an offset value between the detected audio level average and an audio level average of a previously recorded song;

adjusting an audio level of a subsequent song unit on the basis of the offset value; and encoding and recording the subsequent song unit having the adjusted audio level, and wherein the step (a) determines the audio level average of the decoded data by excluding certain parts of the decoded data having an audio level outside of a prescribed range extending from a maximum audio reference level to a minimum audio reference level and the audio level average of the decoded data is an average value of the decoded data having the prescribed range from the maximum audio reference level to the minimum audio reference level in the song.

2. The method as set forth in claim 1, wherein the step (a) records the entry audio data to a recording medium, and the method further comprising:

(c) recording the variably controlled audio level of the song to the recording medium.

3. The method as set forth in claim 2, wherein the recording medium is one of the following: an optical disk, a HDD (hard disk drive), a DRAM (dynamic random access memory), and a flash memory.

4. A method for controlling an audio recording level, comprising the steps of:

a) decoding entry audio data to be recorded in song units, and detecting an audio level average of the decoded entry audio data in song units; and b) variably controlling a level of subsequent decoded audio data on the basis of the detected audio level average, encoding the variably controlled audio data level, and recording the encoded audio data to a recording medium, wherein the step (b) includes the steps of:

calculating an offset value between the detected audio level average and an audio level average of a previously recorded song;

adjusting an audio level of a subsequent song unit on the basis of the offset value; and encoding and recording the subsequent song unit having the adjusted audio level, and wherein the step (a) determines the audio level average of the decoded data by excluding certain parts of the decoded data having an audio level outside of a prescribed range extending from a maximum audio reference level to a minimum audio reference level and the audio level average of the decoded data is an average value of the decoded data having the prescribed range from the maximum audio reference level to the minimum audio reference level in the song.

5. The method as set forth in claim 4, wherein the previously recorded song is a firstly recorded song.

6. The method as set forth in claim 4, wherein the recording medium is one of the following: an optical disk, a HDD (hard disk drive), a DRAM (dynamic random access memory), and a flash memory.

7. The method as set forth in claim 4, wherein the decoded entry audio data is in a first audio format type, and the subsequent decoded audio data is in a second audio format type, the first and second audio format types different from each other.

8. An apparatus for controlling an audio recording level, comprising:
  means for recording entry audio data in song units and simultaneously decoding the audio data, and detecting an audio level average of the decoded data in song units; and
  means for variably controlling an audio level of a song to be recorded later on the basis of the detected audio level average,
  wherein the means for variably controlling the audio level comprises:
  means for calculating an offset value between the detected audio level average and an audio level average of a previously recorded song;
  means for adjusting an audio level of a subsequent song unit on the basis of the offset value; and
  means for encoding and recording the subsequent song unit having the adjusted audio level, and
  wherein the means for recording determines the audio level average of the decoded data by excluding certain parts of the decoded data having an audio level outside of a prescribed range extending from a maximum audio reference level to a minimum audio reference level and the audio level average of the decoded data is an average value of the decoded data having the prescribed range from the maximum audio reference level to the minimum audio reference level in the song.

9. The apparatus as set forth in claim 8, wherein the means for recording records the entry audio data to a recording medium, and records the variably controlled audio level of the song to the recording medium.

10. The apparatus as set forth in claim 9, wherein the recording medium is one of the following: an optical disk, a HDD (hard disk drive), a DRAM (dynamic random access memory), and a flash memory.

11. An apparatus for controlling an audio recording level, comprising:
  first means for decoding entry audio data to be recorded in song units, and detecting an audio level average of the decoded entry audio data in song units; and
  second means for variably controlling a level of subsequent decoded audio data on the basis of the detected audio level average, encoding the variably controlled audio data level, and recording the encoded audio data to a recording medium,
  wherein the second means includes:
  means for calculating an offset value between the detected audio level average and an audio level average of a previously recorded song;
  means for adjusting an audio level of a subsequent song unit on the basis of the offset value; and
  means for encoding and recording the subsequent song unit having the adjusted audio level, and
  wherein the first means determines the audio level average of the decoded data by excluding certain parts of the decoded data having an audio level outside of a prescribed range extending from a maximum audio reference level to a minimum audio reference level and the audio level average of the decoded data is an average value of the decoded data having the prescribed range from the maximum audio reference level to the minimum audio reference level in the song.

12. The apparatus as set forth in claim 11, wherein the previously recorded song is a firstly recorded song.

13. The apparatus as set forth in claim 11, wherein the recording medium is one of the following: an optical disk, a HDD (hard disk drive), a DRAM (dynamic random access memory), and a flash memory.

14. The apparatus as set forth in claim 11, wherein the decoded entry audio data is in a first audio format type, and the subsequent decoded audio data is in a second audio format type, the first and second audio format types different from each other.

* * * * *